(12) United States Patent
Nakamura et al.

(10) Patent No.: US 6,373,000 B2
(45) Date of Patent: Apr. 16, 2002

(54) DOUBLE-SIDED CIRCUIT BOARD AND MULTILAYER WIRING BOARD COMPRISING THE SAME AND PROCESS FOR PRODUCING DOUBLE-SIDED CIRCUIT BOARD

(75) Inventors: Kei Nakamura; Masakazu Sugimoto; Yasushi Inoue; Megumu Nagasawa; Takuji Okeyui; Masayuki Kaneto; Shinya Ota, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/735,893

(22) Filed: Dec. 14, 2000

(30) Foreign Application Priority Data

Dec. 14, 1999 (JP) .............................. 11-354963
May 18, 2000 (JP) ......................... P12-146796

(51) Int. Cl.⁷ ................................................ H01R 23/72
(52) U.S. Cl. ....................... 174/264; 174/261; 174/262; 174/263; 257/698; 361/768
(58) Field of Search ................................ 174/264, 261, 174/262, 263, 266; 361/768, 784, 795; 257/701, 702, 698

(56) References Cited

U.S. PATENT DOCUMENTS

| | | | | |
|---|---|---|---|---|
| 4,950,843 A | * | 8/1990 | Hirota | 174/260 |
| 5,451,721 A | * | 9/1995 | Tsukada et al. | 174/261 |
| 6,159,586 A | | 12/2000 | Inoue et al. | |
| 6,258,449 B1 | * | 7/2001 | Nagasawa et al. | 257/702 |

FOREIGN PATENT DOCUMENTS

| | | | |
|---|---|---|---|
| JP | 61-212096 | 9/1986 | H05K/3/46 |
| JP | 5-259600 | 10/1993 | H05K/1/11 |
| JP | 6-97665 | 4/1994 | H05K/3/46 |
| JP | 6-268381 | 9/1994 | H05K/3/46 |

* cited by examiner

Primary Examiner—Albert W. Paladini
(74) Attorney, Agent, or Firm—Sughrue Mion PLLC

(57) ABSTRACT

A double-sided circuit board of which a solder conductor is prevented from deformation in a cycling test so as to maintain high connection reliability, comprises an insulating layer 2 made of an organic high molecular weight resin and a circuit 3 provided on each side of the insulating layer 2, the circuits 3 on both sides being electrically connected through via-holes filled with a conductor 4 made of solder having a metal powder 6 dispersed therein.

11 Claims, 12 Drawing Sheets

DOUBLE-SIDED CIRCUIT BOARD AND MULTILAYER WIRING BOARD COMPRISING THE SAME AND PROCESS FOR PRODUCING DOUBLE-SIDED CIRCUIT BOARD

FIELD OF THE INVENTION

This invention relates to a double-sided printed wiring board (i.e., double-sided circuit board, hereinafter sometimes abbreviated as double-sided PWB) of which the wiring conductors on both sides are electrically connected with solder having a metal powder dispersed therein, a multilayer printed wiring board (i.e., multilayer wiring board, hereinafter sometimes abbreviated as ML-PWB) comprising the same, and a process for producing the double-sided PWB.

BACKGROUND OF THE INVENTION

With the recent tendencies for electronic equipment to have a smaller size and higher performance, it has been demanded for semiconductor devices constituting electronic equipment and ML-PWBs for mounting the devices to have reduced size and thickness, higher performance and higher reliability. To meet these demands, pin insertion mount package is being displaced by surface mount package, and, in recent years, a surface mount technology called bare chip mount has been under study, in which non-packaged (bare) semiconductor elements are directly mounted on a PWB.

Further, the increasing number of pins of semiconductor elements to be mounted has increased the necessity of stacking a plurality of PWBs. An ML-PWB can be produced by a build up method comprising alternately building up, on one or both sides of a substrate, insulating layers of a photosensitive resin and conductor layers formed by plating or deposition. The build up method is disadvantageous in that the production process is complicated and involves many steps, the yield is low, and much time is required.

In bare chip mounting, on the other hand, because silicon chips having a thermal expansion coefficient of 3 to 4 ppm/° C. are directly mounted on a PWB having a thermal expansion coefficient of 10 to 20 ppm/° C. with an adhesive, stress develops due to the difference in thermal expansion to impair the reliability. The stress also causes cracks in the adhesive, which results in reduction of moisture resistance. In order to relax the stress, it has been practiced to use an adhesive having a reduced elastic modulus thereby to disperse the stress imposed. However, connection reliability achieved by such conventional techniques is still insufficient. It is indispensable for securing further improved reliability to diminish the thermal expansion coefficient of the PWB itself.

Under these circumstances, the present inventors previously proposed (1) a low-expansion double-sided PWB which comprises an insulating layer of an organic high molecular weight resin having a metal core and a wiring conductor provided on each side of the insulating layer, the wiring conductor on both sides being electrically connected via through-holes and (2) a low-expansion ML-PWB which comprises a plurality of the double-sided PWBs integrally laminated with each other via an adhesive layer interposed between every adjacent PWBs, the adhesive layer having through-holes at prescribed positions in contact with the wiring conductors of the adjacent upper and lower double-sided PWBs, and the through-holes containing a conductor made of solder by which the wiring conductors of the upper and the lower double-sided PWBs are electrically connected (see Japanese patent application No. 9-260201).

It has turned out that the above-mentioned double-sided PWB, which has the wiring conductors on both sides thereof electrically connected through via-holes, develops cracks at the corners in a cycling test, which will lead to an electrical connection failure. Further, where a plurality of the above-described double-sided PWBs are superposed on each other to obtain an ML-PWB, the adhesive layer connecting the upper and the lower PWBs is not allowed to have the solder conductors provided at the positions corresponding to the through-holes of the upper and the lower double-sided PWBs, which limits the freedom of wiring design.

To solve these problems, the inventors proposed a low-expansion double-sided PWB having high reliability and high freedom of wiring design, in which the wiring conductors on both sides thereof are electrically connected through via-holes filled with a conductor made of solder (as of yet unpublished Japanese Patent Application No. 9-199690). According to this technique, however, where the insulating layer has a large thickness in relation to the diameter of the via-holes, i.e., where the via-holes have a high aspect ratio, the solder-filled via-holes tend to undergo permanent deformation due to the stress accumulated in a cycling test, which will lead to a failure to connect to the wiring conductors.

SUMMARY OF THE INVENTION

An object of the present invention is to provide a double-sided PWB (double-sided circuit board) and an ML-PWB (multilayer wiring board) comprising the double-sided PWBs in which a conductor made of solder is prevented from deformation in a cycling test so that high connection reliability can be maintained.

Another object of the present invention is to provide a process for producing the double-sided PWB.

The present inventors have conducted extensive study seeking a double-sided PWB of which the conductor made of solder is prevented from deformation in a cycling test. As a result, they have found that the above objects are accomplished by the following invention.

The invention provides, in its first aspect, a double-sided PWB comprising an insulating layer made of an organic high molecular weight resin having on each side thereof a wiring conductor, wherein the wiring conductors on both sides are electrically connected through via-holes filled with a conductor made of solder having a metal powder dispersed therein.

The invention provides, in its second aspect, an ML-PWB which comprises a plurality of the double-sided PWBs integrally laminateded with each other via an adhesive layer interposed between every adjacent PWBs, the adhesive layer having through-holes at prescribed positions in contact with the wiring conductors of the adjacent upper and lower double-sided PWBs and the through-holes being filled with a conductor made of solder by which the wiring conductors of the upper and the lower double-sided PWBs are electrically connected.

The invention provides, in its third aspect, a process for producing the double-sided PWB comprising the steps of:

(1) providing at least one through-hole in an insulating layer comprising an organic high molecular weight resin;

(2) pressing a mixture of a metal powder and a solder powder at a predetermined mixing ratio into the through-hole;

(3) melting the solder powder in the insulating layer into which the metal powder and the solder powder are pressed in the through-hole, under pressure, to fill the through-hole with a conductor of solder having the metal powder dispersed therein; and (4) laminating both sides of the insulating layer from step (3) with copper foil and melting the conductor of solder.

According to the invention, plastic deformation of the solder conductor is prevented by the hard metal powder dispersed in the soft solder thereby to secure sufficient strength while maintaining low connection resistance. Thus, deformation of the solder conductor in a cycling test can be suppressed, and high connection reliability can be retained.

In a highly preferred embodiment of the invention, the insulating layer contains an Ni—Fe-based alloy foil as a core. According to this embodiment, the presence of one low-expansion Ni—Fe-based alloy layer (core) per two wiring conductor layers brings the thermal expansion coefficient of the double-sided PWB as a whole very close to that of silicon even where the wiring conductors are made of copper. The lowered thermal expansion coefficient of the double-sided PWB secures extremely high reliability even in bare chip mount.

DETAILED DESCRIPTION OF THE INVENTION

The organic high molecular weight resin which can be used as an insulating layer preferably includes polyimide resins, epoxy resins, and mixtures thereof for their heat resistance and electrical characteristics. An adhesive sheet made of such an organic high molecular weight resin is conveniently used. The adhesive sheet preferably has a thickness of about 0.01 to 1.0 mm. An adhesive sheet with a smaller thickness than about 0.01 mm tends to have poor workability. With the thickness larger than about 1.0 mm, it may be difficult to completely fill the through-holes with the metal/solder mixed powder, resulting in reduced reliability.

The means for making the through-holes in the insulating layer is appropriately chosen depending on the desired size of the holes. For example, drilling, punching, laser machining and the like can be adopted.

The composition of solder powder, which becomes a solder conductor on melting, includes, but is not limited to, Sn—Pb alloys, Sn—Ag alloys, Sn—Ag—Cu alloys, Sn—Ag—Cu—Bi alloys, Sn—Ag—Bi alloys, Sn—Zn alloys, Sn—Cu alloys, Sn—Sb alloys, and Sn—Au alloys. An optimum solder composition for the desired heat resistance is chosen. The solder powder usually has a particle size of 50 $\mu$m or smaller, preferably 10 $\mu$m or smaller. The solder powder preferably has a melting point of 150 to 350° C.

The metal powder, which is to be dispersed in a solder conductor, preferably includes powder of Ni, Au, Ag, Cu, Fe, Al, Cr, Pd or Co, and powder of alloys comprising at least one of these metals. The metal powder usually has a particle size of 50 $\mu$m or smaller, preferably 10 $\mu$m or smaller. The metal powder preferably has a melting point of 350° C. or higher.

It is preferred that the melting point of the metal powder is higher by at least 5° C. than that of the solder powder.

Figure 34:
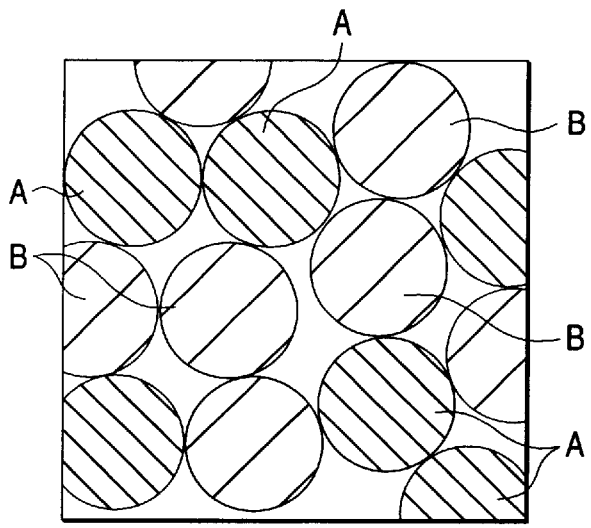
FIG. 34 is a schematic illustration of a metal powder and a solder powder injected into a via-hole.
Figure 35:
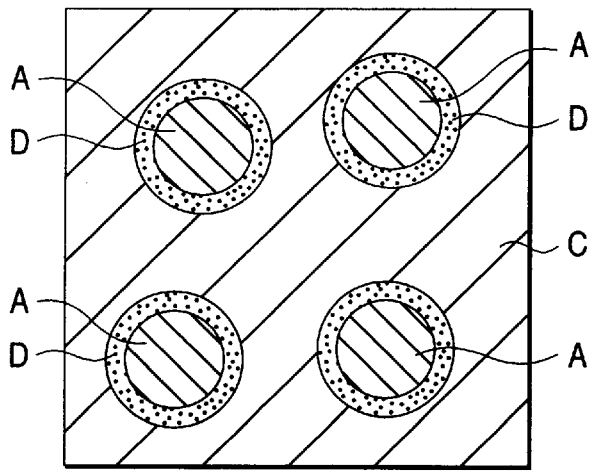
FIGS. 35 and 36 each schematically illustrate the cross section of the via-hole of FIG. 34 after the solder powder is melted.
Figure 36:
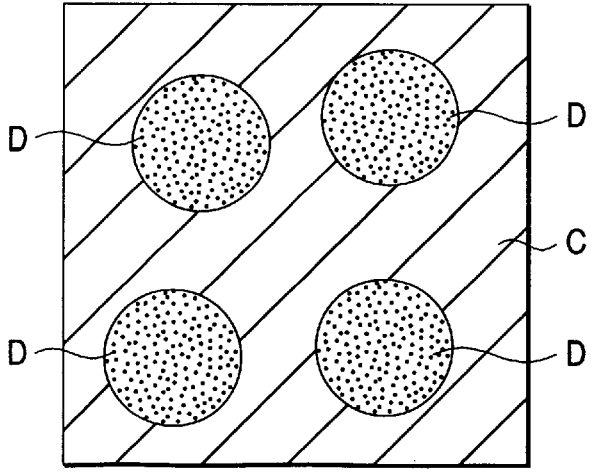

Via-holes filled with a solder conductor having a metal powder dispersed therein can be formed, for example, as follows. The metal powder, the solder powder and an organic solvent are mixed at a predetermined ratio into paste. The paste is applied in excess on the openings of through-holes by printing. After removing the organic solvent by drying, the mixture is injected (pressed) into the through-holes by pressing down. While the mixed powder is being injected, metal particles A and solder particles B rub against themselves as well as mutually (see FIG. 34), whereby the surface oxide film of these particles is destroyed. Then, excess powder is removed from the surface, and the insulating layer is heated under pressure at or above the melting point of the solder, whereby the solder powder melts to form a conductor having the metal powder dispersed therein. Thoroughly melting the solder generally results in formation of an alloy layer D made from the metal and the solder material on the surface of the metal particles A as schematically depicted in FIG. 35. The alloy layer D is formed by the solder material's diffusing and reacting. The alloy layer D serves as an affinity between the metal particles A and the solder conductor C to provide improved electrical and mechanical characteristics. The growth rate of the alloy layer D depends on the temperature and time. The alloy layer D gains in thickness with time until the whole metal particle becomes an alloy D as shown in FIG. 36, which is also included under the scope of the present invention.

The metal powder is preferably used in an amount of 0.1 to 60% by weight based on the solder powder. In lower amounts, the effect in suppressing deformation of the via-holes in a cycling test is insubstantial. In higher amounts, the proportion of the solder material is insufficient for binding the metal particles, and the resulting conductor is so brittle as to develop cracks.

The mixing ratio of the organic solvent is decided according to the dispersibility of the mixed powder in the resulting paste and is preferably 1 to 70% by volume based on the mixed powder. Alcohol solvents are suitable. The paste may be prepared by previously plating the metal powder with solder and mixing the plated metal powder with the organic solvent into paste.

The adhesive sheet (insulating layer) having the via-holes is laminated with copper foil as a conductor layer on its both sides, and the laminate is heated under pressure at or above the melting point of the solder conductor to melt the solder conductor thereby to secure the electrical connections between the copper foil and the via-holes. The copper foil on each side is etched in a conventional manner according to a desired circuit pattern to produce the double-sided PWB of the present invention.

The insulating layer can contain a metal foil or a ceramic material as a core so as to have a reduced thermal expansion coefficient. The metal which can be used as a core includes Fe, Ni, Cr, Al, Ti, Cu, Co, or an alloy thereof. In order for the metal foil or the ceramic material to serve to suppress expansion of the conductor layer and the insulating layer, their own thermal expansion coefficient should be sufficiently low. In the case of an Ni—Fe-based alloy foil, for instance, whose thermal expansion coefficient varies with the alloying ratio, a preferred Ni content ranges from 31 to 50% by weight, particularly from 31 to 45% by weight. Out of this range, the alloy tends to have a fairly higher thermal expansion coefficient than silicon chips. The metal foil has a thickness of 10 to 300 $\mu$m, preferably 10 to 200 $\mu$m, still preferably 10 to 100 $\mu$m. With a thickness smaller than 10 $\mu$m, the difference in thermal expansion between the double-sided PWB and silicon chips cannot be reduced sufficiently.

The ML-PWB of the invention can be produced as follows. An adhesive sheet having through-holes is stuck to one or both sides of the double-sided PWB of the invention at right positions so that the through-holes may correspond to desired positions of the double-sided PWB. A solder paste is applied into the through-holes of the adhesive sheet by printing, followed by heat melting the paste to form solder bumps. A plurality of the double-sided PWBs having solder bumps are stacked on each other at right positions, and the laminate is press bonded under heat into an integral body. The through-holes of the adhesive sheet may be at positions of the circuit on the via-holes connecting the wiring conductors on both sides of the double-sided PWB.

Serving as an insulating layer after stacking, the adhesive sheet used in the production of the ML-PWB preferably includes a sheet of polyimide resins, epoxy resins or mixtures thereof for their heat resistance and electrical characteristics. The thickness of the adhesive sheet is preferably about 0.01 to 1.0 mm. Too thin an adhesive sheet has poor workability. If the thickness is too large, it is difficult to completely fill the through-holes with the solder paste, resulting in reduced reliability.

The through-holes can be made in the adhesive sheet by any known techniques selected from drilling, punching, laser machining, and the like according to the size of the openings. The adhesive sheet having through-holes can be adhered temporarily on one or both sides of the double-sided PWB by hot pressing. Alternatively, the through-holes may be made by laser machining after the adhesive sheet is temporarily stuck to one or both sides of the double-sided PWB. Lasers which can be used include a carbonic acid gas laser, an excimer laser, a YAG laser, etc.

Commercially available solder paste can be used to form solder bumps. The size of solder bumps is 100 $\mu$m or smaller, preferably 50 $\mu$m or smaller, still preferably 10 $\mu$m or smaller. The solder composition is not particularly limited and can be selected in accordance with the heat resistance required of the wiring board. After stacking, the solder bumps are bought into contact with an opposite electrode to establish electrical connections. If desired, the laminate may be heated at or above the melting point of the solder either simultaneously with or after the press bonding to form metallic joints.

The practice of the present invention will be described with reference to the accompanying drawings.

Figure 1:
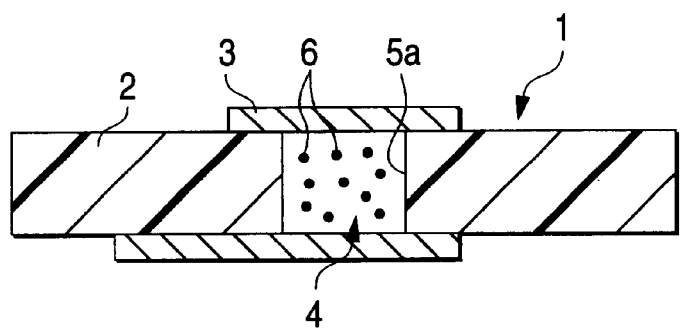
FIG. 1 is a schematic cross section showing an embodiment of the double-sided PWB according to the present invention.

FIG. 1 shows an embodiment of the present invention, in which numeral 1 is a double-sided PWB composed of an insulating layer 2 made of a polyimide resin having formed on both sides thereof a circuit (wiring conductor) 3 made of a copper foil. The circuits 3 on both sides are electrically connected by a via-hole 5a of the insulating layer 2 filled with a solder conductor having a metal powder 6 dispersed therein.

Figure 2:
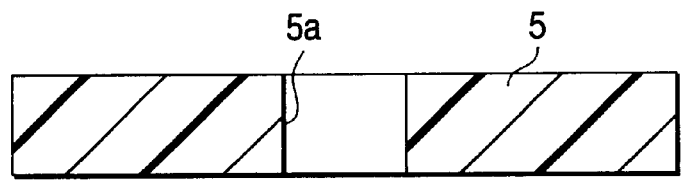
FIGS. 2 through 5 illustrate the process for producing the double-sided PWB of FIG. 1.
Figure 3:
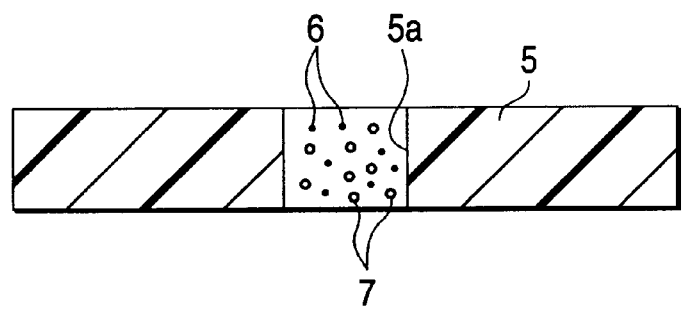
Figure 4:
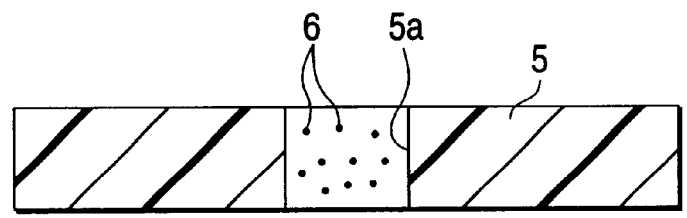
Figure 5:
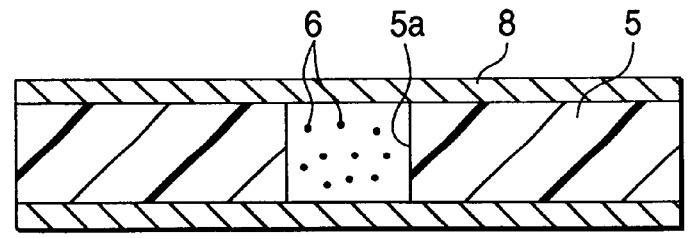

The double-sided PWB 1 is produced, for example, as follows. As shown in FIG. 2, through-holes 5a are made in a polyimide adhesive sheet 5, which becomes an insulating layer 2, at predetermined positions (positions where via-holes filled with a solder conductor 4 are to be formed). As shown in FIG. 3, a mixture comprising a metal powder 6 and a solder powder 7 at a prescribed mixing ratio is pressed into the through-holes 5a and melted to fill the through-holes 5a with a solder conductor having the metal powder 6 dispersed therein (FIG. 4). A copper foil 8 is adhered to both sides of the adhesive sheet 5, and the laminate is heated under pressure at or above the melting point of the solder powder to cause the solder to reflow, thereby securing the electrical connections of the copper foils on both sides (FIG. 5). Each of the copper foils is etched in a conventional manner to form a circuit layer 3 (FIG. 1).

According to this embodiment, the solder conductor 4 is prevented from plastic deformation owing to the metal powder 6 dispersed therein. The dispersed metal powder 6 and the solder form an alloy layer, and the via-holes 5a filled with the solder conductor 4 have low electrical resistance. Further, since the circuit layers 3 on both sides are electrically and mechanically connected to each other by the metal joints of the solder conductor 4, extremely high reliability is enjoyed.

Figure 6:
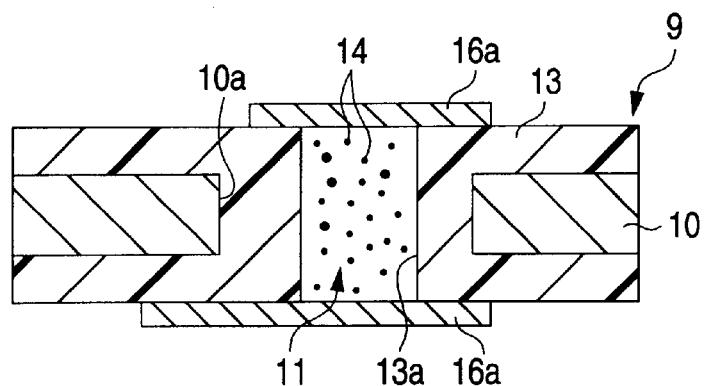
FIG. 6 is a schematic cross section showing another embodiment of the double-sided PWB according to the present invention.
Figure 7:
FIGS. 7 through 12 illustrate a process for producing the double-sided PWB of FIG. 6.
Figure 8:
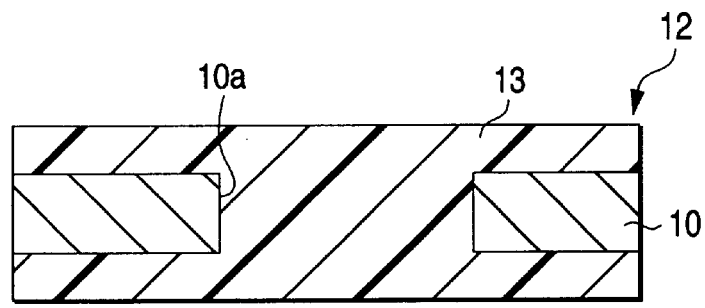
Figure 9:
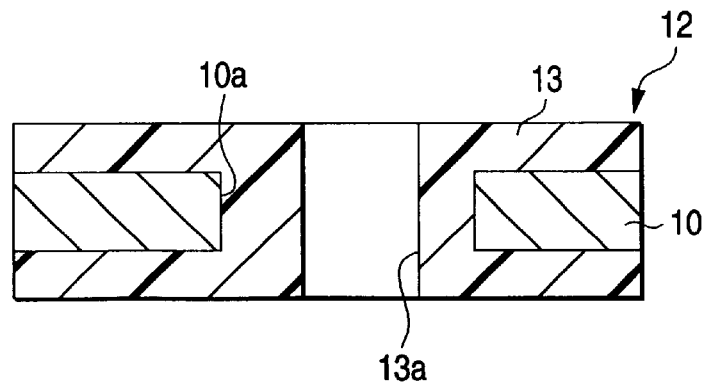
Figure 10:
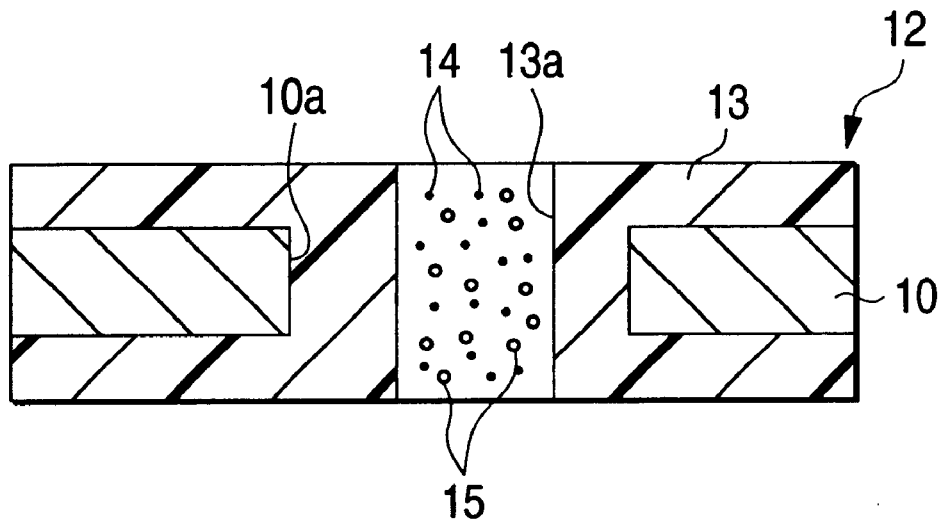
Figure 11:
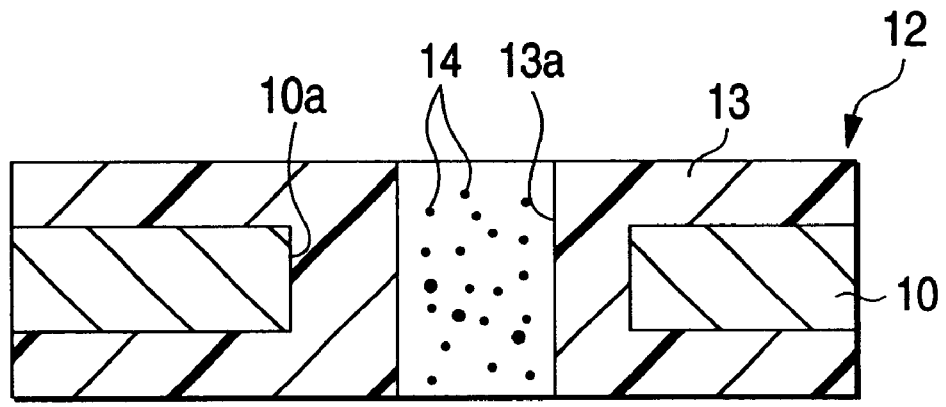
Figure 12:
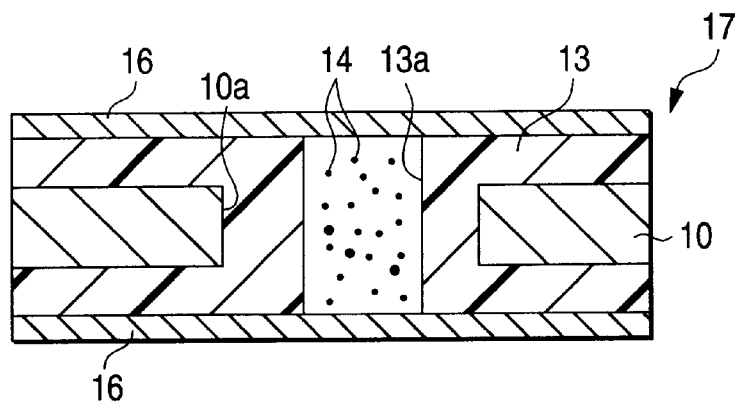

A double-sided PWB 9 shown in FIG. 6, in which an insulating layer 13 has a metal core 10, is produced, for example, as follows. As shown in FIG. 7, through-holes 10a are made in an Ni—Fe alloy foil 10 at predetermined positions (i.e., positions where via-holes filled with a solder conductor 11 are to be formed). The foil having the through-holes 10a is sandwiched in between a pair of polyimide adhesive sheets (which become an insulating layer 13 together) to prepare a composite 12 (FIG. 8). As shown in FIG. 9, through-holes 13a are made in the composite 12 at the same positions as the through-holes 10a of the alloy foil 10, the former being smaller than the latter. A mixture of a metal powder 14 and a solder powder 15 is pressed into the through-holes 13a (FIG. 10), the solder powder 15 is melted (FIG. 11), and a copper foil 16 is adhered to both sides of the composite 12. The laminate is heated under pressure at or above the melting point of the solder to cause the solder to reflow, thereby to secure the electrical connections of the copper foils 16 on both sides (FIG. 12). Each of the copper foils 16 is etched in a conventional manner to form a circuit layer 16a (FIG. 6).

In the embodiment shown in FIGS. 6 to 12, the thermal expansion coefficient of the composite 17 is governed by the Ni—Fe alloy of the core and can therefore be adjusted by changing the Ni/Fe alloying ratio or the thickness of the core.

Figure 13:
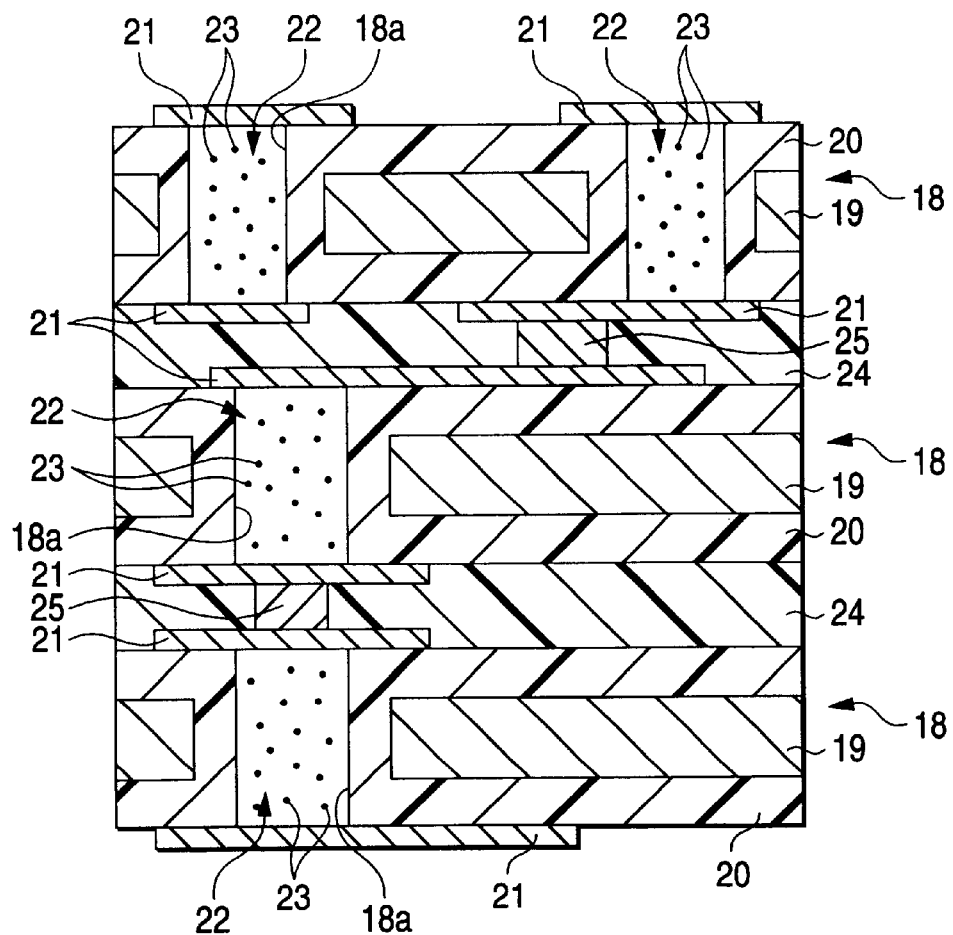
FIG. 13 is a schematic cross section of an embodiment of the ML-PWB according to the present invention.

FIG. 13 shows an example of the ML-PWB according to the invention, which comprises a plurality of double-sided PWBs 18 each having an insulating polyimide resin layer 20 containing an Ni—Fe alloy foil 19 as a core and a circuit layer (wiring conductor) 21 made of a copper foil on each side thereof. In this particular example, three double-sided PWBs 18 are stacked to provide six circuit layers. Each double-sided PWB 18 has via-holes 18a filled with a solder conductor 22 having a metal powder 23 dispersed therein, through which the circuit layers 21 on both sides are electrically connected. Numeral 24 represents a polyimide adhesive with which adjacent two double-sided PWBs 18 are adhered to each other. Numeral 25 is a solder conductor with which the circuit layers 21 of adjacent two double-sided PWBs 18 are electrically connected.

Figure 14:
FIGS. 14 through 17 illustrate a process for producing the ML-PWB of FIG. 13.
Figure 15:
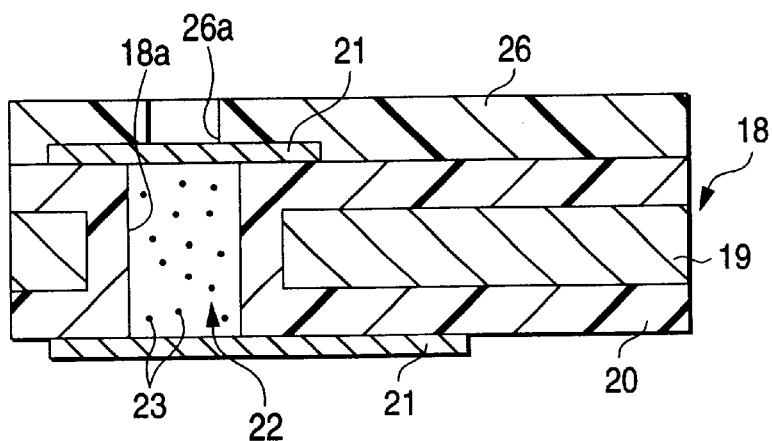
Figure 16:
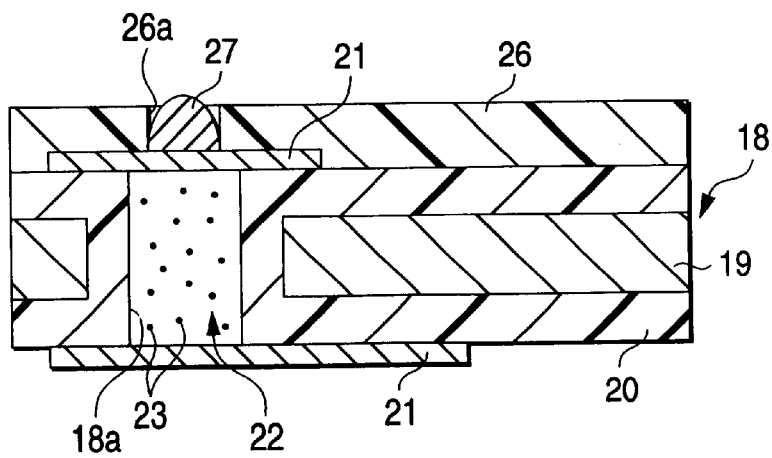
Figure 17:
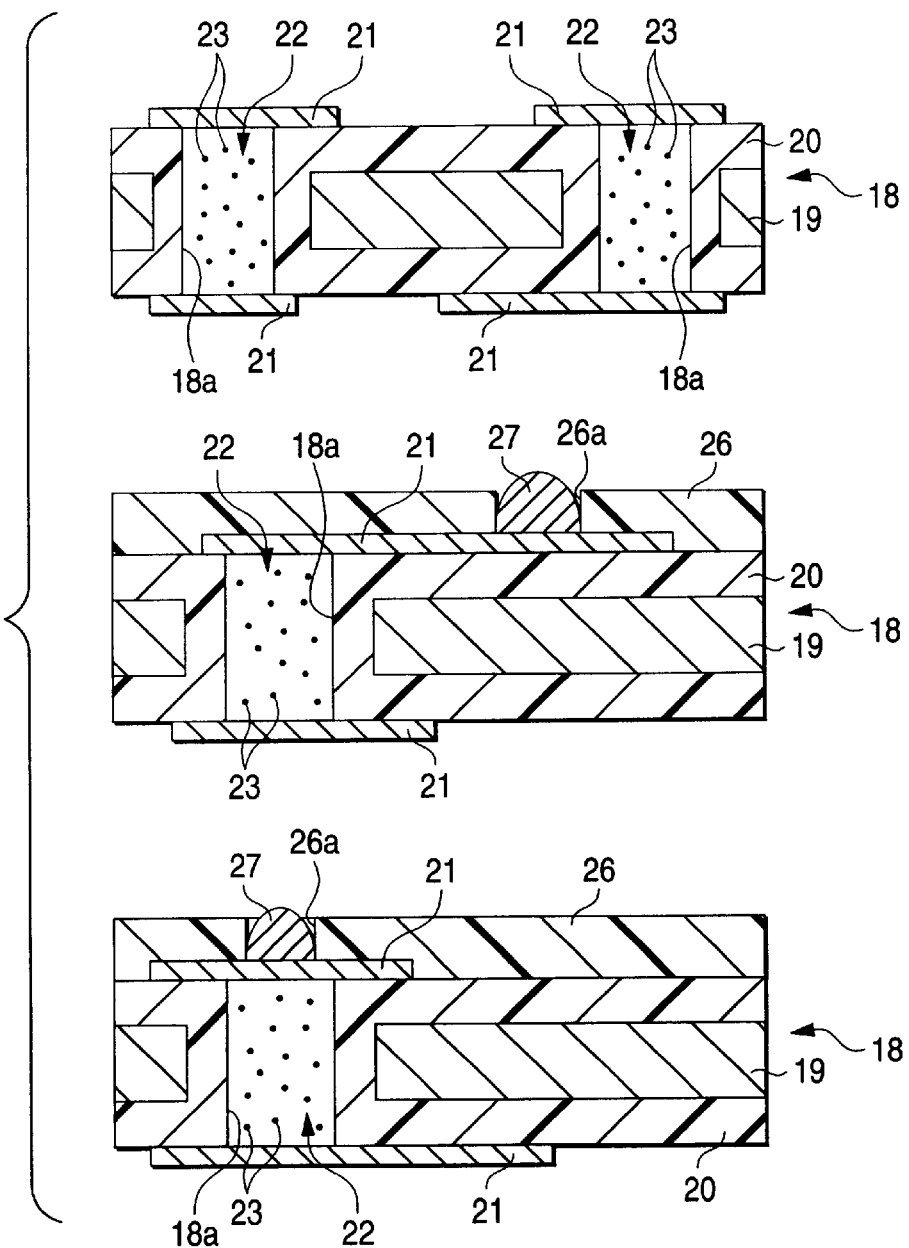

The ML-PWB of FIG. 13 can be prepared, for example, as follows. Three double-sided PWBs 18 each having a polyimide resin insulating layer 20 and a circuit layer 21 made of a copper foil on each side thereof (shown in FIG. 13) and two adhesive sheets 26 (shown in FIG. 14) made of a polyimide adhesive are prepared. As shown in FIG. 15, the adhesive sheet 26 is stuck to the upper side of two out of three double-sided PWBs 18 in a right position with its openings 26a mating with prescribed positions of the circuit layer 21 of the PWB 18 (for example, the opening 26a shown in FIG. 15 is positioned where the solder conductor 22 has been formed). A solder paste is applied to the openings 26a of each adhesive sheet 26 by screen printing and heat-melted to form solder bumps 27 on the circuit layer 21. As shown in FIG. 17, the two double-sided PWBs 18 having solder bumps 27 and another double-sided PWB 18 are superposed on each other at right positions, and the resulting laminate is heated under pressure to give a six-layered PWB having three double-sided PWBs 18 united into one body shown in FIG. 13, in which the adhesive sheets 24 correspond to the adhesive sheets 26, and the solder conductors 25 correspond to the solder bumps 27.

In the embodiment shown in FIGS. 13 to 17, although the via-holes 18a of the insulating layer 20 have a high aspect ratio because of the Ni—Fe alloy foil 19 as a core, plastic deformation of the via-holes 18a can be suppressed by the presence of the metal powder 23 in the solder conductor 22 thereby to maintain high connection reliability. While the solder conductors 25 which electrically connect every adjacent double-sided PWBs 18 do not contain metal powder, they are free from the problem of plastic deformation because the via-holes 26a have a small aspect ratio.

The solder conductors 25 can be disposed at arbitrary positions without being restricted by the positions of the via-holes 18a filled with the solder conductor 22 having the metal powder 23 dispersed therein. As a result, the freedom of wiring design is broad, enabling high-density wiring.

Uniting the three double-sided PWBs 18 into one body and electrically connecting the six circuit layers can be carried out simultaneously in a single operation of heating under pressure. One Ni—Fe alloy layer per two circuit layers makes it possible to reduce the thermal expansion coefficient of the six-layered PWB as a whole even where the circuits 21 are made of copper.

The present invention will now be illustrated in greater detail with reference to Examples, but it should be understood that the invention is not deemed to be limited thereto. Unless otherwise noted, all the percents are by weight.

EXAMPLE 1

Figure 18:
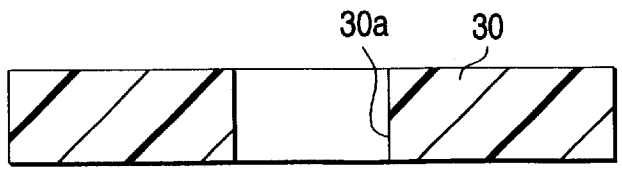
FIGS. 18 through 21 illustrate the process for producing the double-sided PWB of Example 1.
Figure 19:
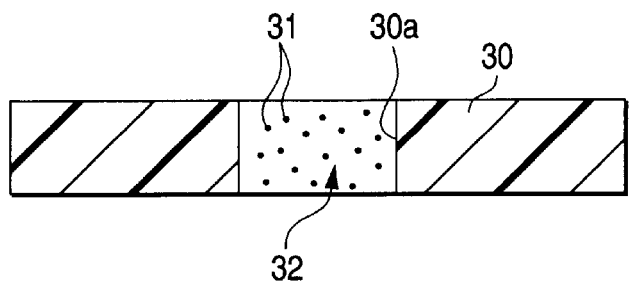
Figure 20:
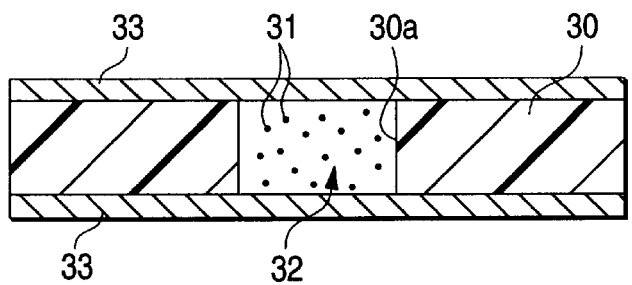
Figure 21:
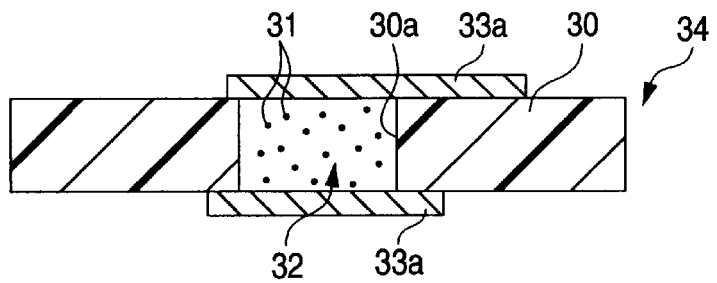

A 100 μm thick polyimide adhesive sheet 30 was punched at predetermined positions to make through-holes 30a having a diameter of 100 μm (FIG. 18). A paste prepared by mixing 30% of an Ni powder 31 (average particle size: 10 μm) and 70% of an Sn/Pb solder powder (average particle size: 10 μm) and kneading the mixture with the same volume of an alcohol solvent was screen printed on the through-holes 30a via a metal mask (thickness: 100 μm; diameter of openings: 100 μm). After the solvent was evaporated, the printed powder was pressed into the through-holes 30a by pressing at 30° C. and 10 MPa for 5 minutes. The excess powder on the surface was removed by buffing. The sheet was heated up to 200° C. under pressure to melt the solder powder to form via-holes filled with a solder conductor 32 having the Ni powder 31 dispersed therein (FIG. 19). A 18 μm thick copper foil 33 was press bonded to each side of the adhesive sheet 30 at 175° C. and 5 MPa for 60 minutes, followed by solder reflow at 200° C. and 5 Ma for 5 minutes (FIG. 20). The copper foil 33 on each side was etched in a conventional manner to produce a double-sided PWB 34 having a circuit 33a on each side thereof (FIG. 21).

EXAMPLE 2

Figure 22:
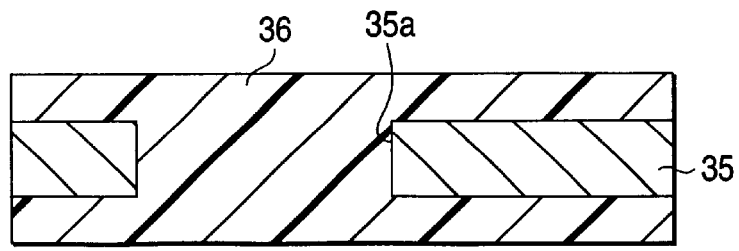
FIGS. 22 through 24 illustrate the process for producing the low-expansion double-sided PWB of Example 2.
Figure 23:
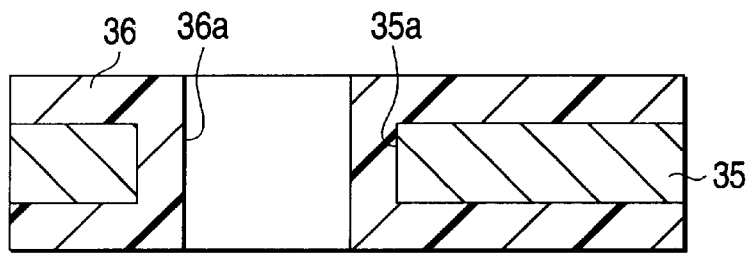
Figure 24:
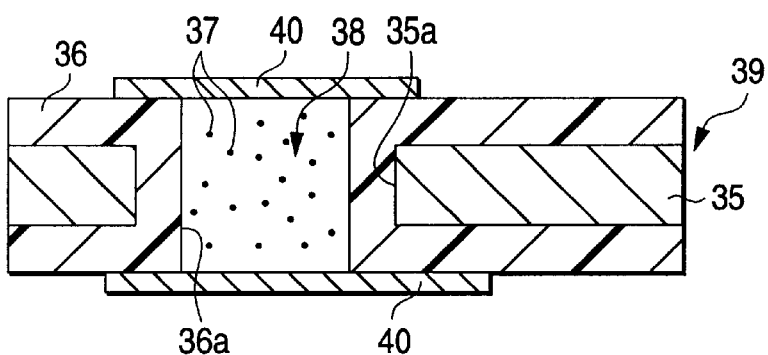

Holes having a diameter of 150 μm were punched through a 100 μm thick Ni—Fe alloy foil 35 (Ni: 36%; Fe: 64%; thermal expansion coefficient: 1.5 ppm/° C.) at predetermined positions at a pitch of 300 μm. A 50 μm thick polyimide adhesive sheet 36 (available from Nippon Steel Chemical Co., Ltd.) was press bonded on each side of the foil at 200° C. and 5 MPa for 60 minuets (FIG. 22). Through-holes 36a having a diameter of 100 μm were punched at the same positions as the holes 35a (FIG. 23). A low-expansion double-sided PWB 39 having via-holes filled with a solder conductor 38 having a metal powder 37 dispersed therein (FIG. 24) was produced by using the resulting foil-cored insulating layer in the same manner as in Example 1. In FIG. 24, numeral 40 is a circuit.

EXAMPLE 3

Holes having a diameter of 150 μm were punched through a 100 μm thick Ni—Fe alloy foil 35 (Ni: 36%; Fe: 64%; thermal expansion coefficient: 1.5 ppm/° C.) at predetermined positions at a pitch of 300 μm. A 50 μm thick polyimide adhesive sheet 36 (available from Nippon Steel Chemical Co., Ltd.) was press bonded on each side of the foil at 200° C. and 4 MPa for 60 minuets (FIG. 22). Through-holes 36a having a diameter of 100 μm were punched at the same positions as the holes 35a (FIG. 23). A paste prepared by mixing 30% of an Ni powder (average particle size: 10 μm) and 70% of an Sn/Sb solder powder (average particle size: 10 μm; available from Nihon Genma K.K.) and kneading the mixture with the same volume of an alcohol solvent was screen printed on the through-holes 36a via a metal mask (thickness: 50 μm; diameter of openings: 100 μm). After the solvent was evaporated, the printed powder was pressed into the through-holes 36a by pressing at 30° C. and 10 MPa for 5 minutes. The excess powder on the surface was removed by buffing. The sheet was heated up to 250° C. under pressure to melt the solder powder to form via-holes filled with a solder conductor 38 having the Ni powder 37 dispersed therein (FIG. 24). A 18 μm thick copper foil was press bonded to each side of the adhesive sheet at 200° C. and 5 MPa for 60 minutes, followed by solder reflow at 250° C. and 5 Ma for 5 minutes. The copper foil on each side was etched in a conventional manner to produce a low-expansion double-sided PWB 39 having a circuit 40 on each side thereof (FIG. 24).

EXAMPLE 4

Figure 25:
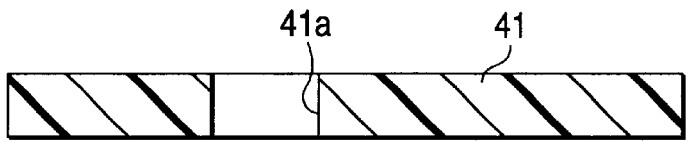
FIGS. 25 to 29 illustrate the process for producing the six-layered PWB of Example 3.
Figure 26:
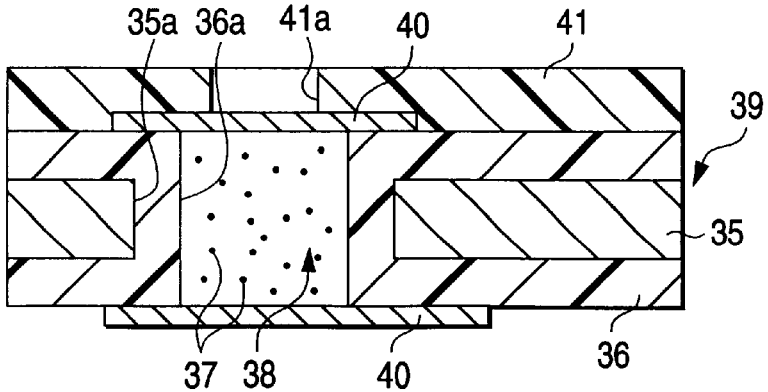
Figure 27:
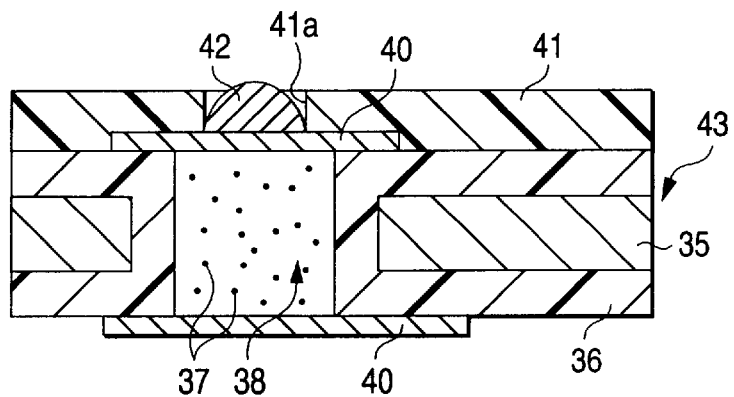
Figure 28:
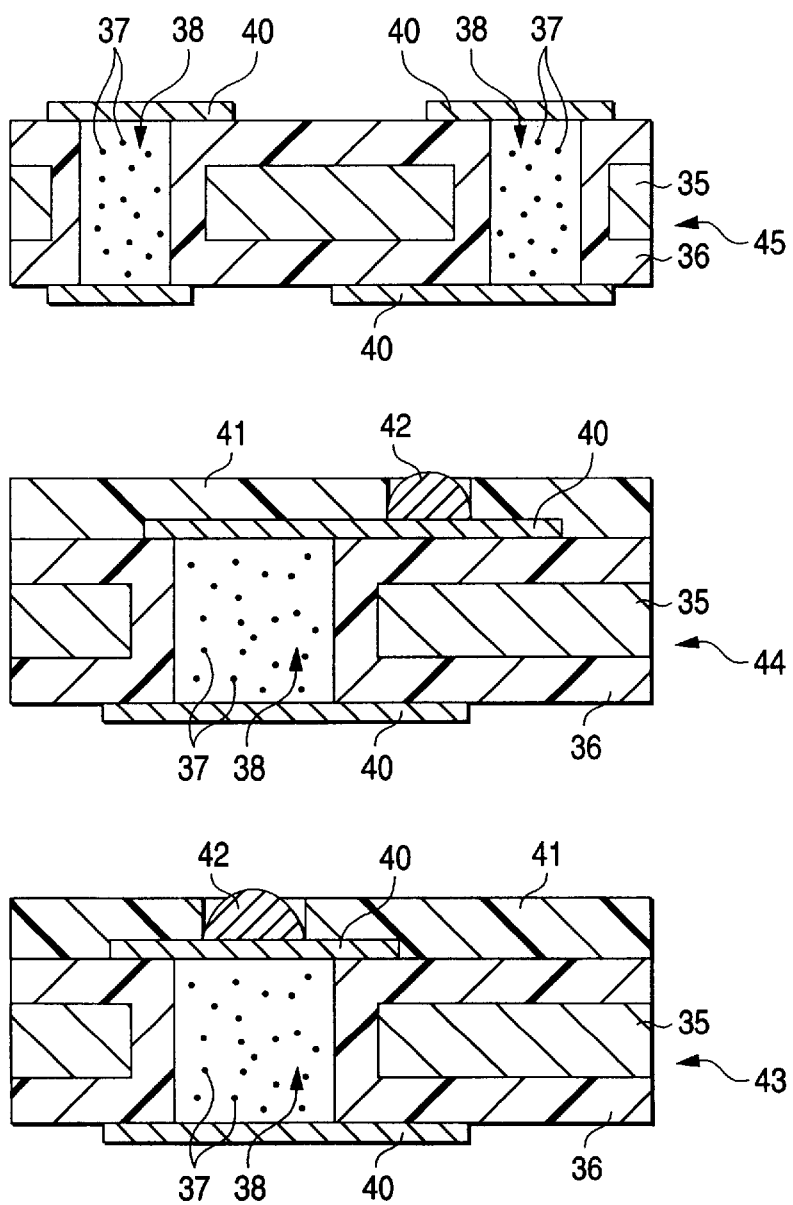
Figure 29:
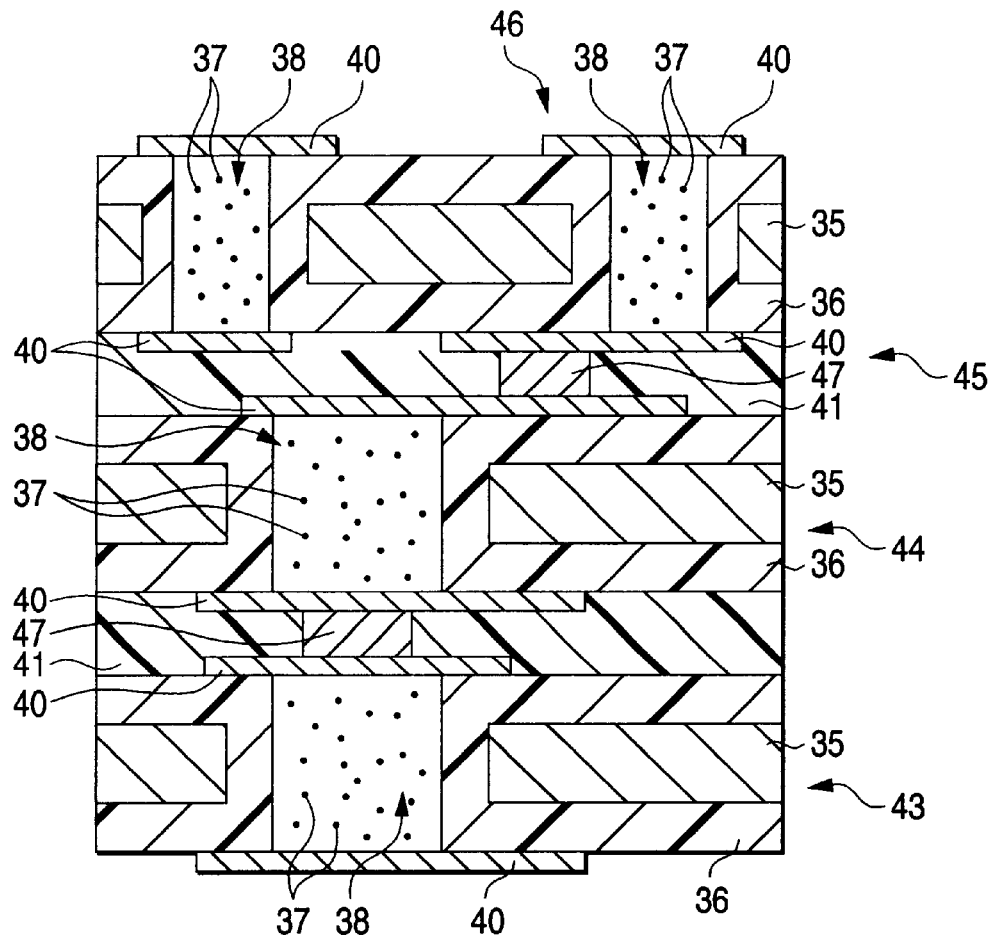

An polyimide adhesive sheet 41 (SPB-035A, available from Nippon Steel Chemical Co., Ltd.) having through-holes 41a having a diameter of 100 μm punched (FIG. 25) was correctly positioned on the low-expansion double-sided PWB 39 obtained in Example 3 and press bonded at 175° C. and 2 MPa for 30 minutes (FIG. 26). The through-holes 41a of the adhesive sheet 41 were filled with a solder paste (SQ10-11, available from Tamura Kakensha) by screen printing. The solder was made to reflow at 220° C., and the flux was washed away to provide a double-sided PWB 43 having solder bumps 42 (FIG. 27). In the same manner another double-sided PWB 44 having solder bumps 42 was prepared. The two double-sided PWBs 43 and 44 and a double-sided PWB 45 prepared in the same manner as in Example 3 were superposed in this order at right positions (FIG. 28), and the laminate was press bonded at 175° C. and 5 MPa for 60 minutes to obtain an integral six-layered PWB 46 (FIG. 29), in which numeral 47 indicates a solder conductor.

EXAMPLE 5

A polyimide adhesive sheet 41 (SPB-035A, available from Nippon Steel Chemical Co., Ltd.) having through-holes 41a having a diameter of 100 μm punched (see FIG. 25) was correctly positioned on the low-expansion double-sided PWB 39 obtained in Example 3 and press bonded at 175° C. and 20 MPa for 30 minutes (FIG. 26). The through-holes 41a of the adhesive sheet 41 were filled with an Sn/Sb solder paste (available from Nippon Genma K.K.) by screen printing. The solder was made to reflow at 260° C., and the flux was washed away to provide a double-sided PWB 43 having solder bumps 42 (FIG. 27). In the same manner another double-sided PWB 44 having solder bumps 42 was prepared. The two double-sided PWBs 43 and 44 and a double-sided PWB 45 prepared in the same manner as in Example 3 were superposed in this order at right positions (FIG. 28), and the laminate was press bonded into an integral body at 200° C. and 5 MPa for 30 minutes, followed by solder reflow under pressure at 250° C. for 5 minutes to obtain an integral six-layered PWB 46 (FIG. 29), in which numeral 47 indicates a solder conductor.

COMPARATIVE EXAMPLE 1

Figure 30:
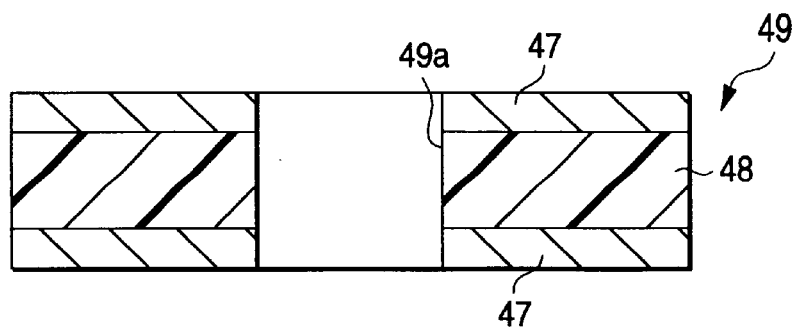
FIG. 30 illustrates the process for producing the double-sided PWB of Comparative Example 1.
Figure 31:
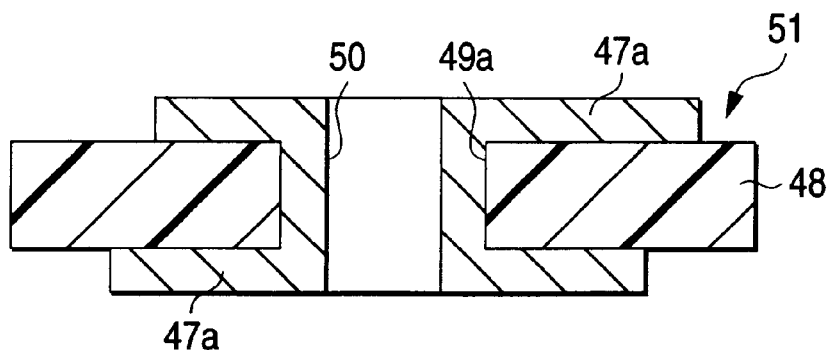
FIG. 31 is a schematic cross section of the double-sided PWB of Comparative Example 1.

A double-sided copper clad laminate 49 having a total thickness of 50 μm composed of a polyimide resin layer 48 and copper foils 47 each having a thickness of 18 μm (NEOFLEX-231R, available from Mitsui Toatsu Chemicals, Inc.) was punched to make through-holes 49a having a diameter of 100 μm at predetermined positions at a pitch of 300 μm (FIG. 30). The inner wall of the through-holes 49a was plated with copper to a deposit thickness of 10 μm, and the copper foil 47 on each side was etched in a conventional manner to prepare a double-sided PWB 51 having a circuit 47a on each side (FIG. 31).

COMPARATIVE EXAMPLE 2

A double-sided PWB was prepared in the same manner as in Example 1, except for using a paste prepared by kneading an Sn/Pb solder powder (average particle size: 10 μm) with the same volume of an alcohol solvent in place of the paste containing the Ni powder.

COMPARATIVE EXAMPLE 3

Figure 32:
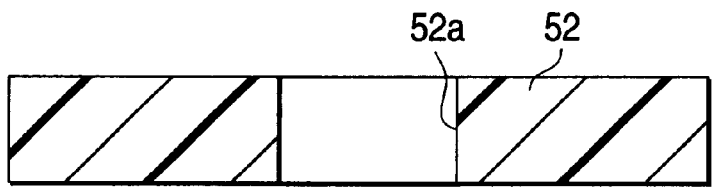
FIG. 32 illustrates the process for producing the double-sided PWB of Comparative Example 3.
Figure 33:
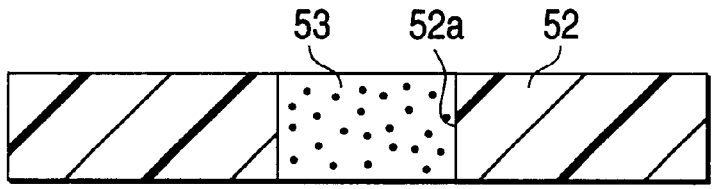
FIG. 33 is a schematic cross section of the double-sided PWB of Comparative Example 3.

Through-holes 52a having a diameter of 100 μm were punched in a 100 μm thick polyimide adhesive sheet 52 at predetermined positions (FIG. 32). A conductive paste consisting of 85% of spherical copper particles having an average particle size of 5 μm as a conductive filler, 12.5% of a thermosetting epoxy resin, and 2.5% of an acid anhydride curing agent was applied into the through-holes 52a by screen-printing and cured by heating at 175° C. for 60 minutes to form conducting via-holes 53 (FIG. 33). A copper foil was adhered to each side of the adhesive sheet 52 in the same manner as in Example 1 and etched in a conventional manner to prepare a double-sided PWB.

Reliability of electrical connection through the via-holes of the double-sided PWBs obtained in Examples 1 to 3 and Comparative Examples 1 to 3 was evaluated in a thermal shock test (in liquid; −55° C.×5 mins ƒ→125° C.×5 minutes). Table 1 below shows the number of cycles at which a connection failure occurred. A change in resistivity exceeding ±10% was regarded as a connection failure.

TABLE 1

|  | Thermal Shock Test (cycle) |
| --- | --- |
| Example 1 | 1000 |
| Example 2 | 1000 |
| Example 3 | 1000 |
| Compara. Example 1 | 50 |
| Compara. Example 2 | 100 |
| Compara. Example 3 | 100 |

The double-sided PWB of Comparative Example 1 which has a conventional via-hole structure develops a connection failure on the 50th thermal shock cycle. In the double-sided PWB of Comparative Example 2 in which the electrical connection between the upper and lower circuits is made by a solder conductor containing no metal powder, the solder-filled via-holes undergo deformation with the thermal shock cycles and develop a connection failure on the 100th cycle.

To the contrary, the double-sided PWBs of Examples 1 to 3 show no deformation of the via-holes until the 1000th cycle, suppressing the resistivity change within ±10%. It is obvious that these double-sided PWBs having a solder conductor having an Ni powder dispersed therein exhibit high connection reliability between the two circuits.

The thermal expansion coefficient of the (multilayer) double-sided PWBs of Examples 2 to 5 having an Ni—Fe alloy foil as a low-expansion core in the insulating layer per two wiring conductor layers and the double-sided PWBs of Comparative Examples 1 to 3 and Example 1 having no metal foil was measured in a temperature range of from room temperature (25° C.) to 200° C. The results are shown in Table 2 below.

TABLE 2

|  | Thermal Expansion Coefficient (ppm/° C.) |
| --- | --- |
| Example 1 | 17.0 |
| Example 2 | 4.0 |
| Example 3 | 4.0 |
| Example 4 | 4.0 |
| Example 5 | 4.0 |
| Compara. Example 1 | 17.0 |
| Compara. Example 2 | 17.0 |
| Compara. Example 3 | 17.0 |

It is seen from Table 2 that the double-sided PWBs having an Ni—Fe alloy foil as a core (Examples 2 and 3) have an extremely decreased thermal expansion coefficient.

The ML-PWB of Examples 4 and 5 prepared by using three double-sided PWBs of Example 3 also have an extremely low thermal expansion coefficient (4 ppm/° C.). Further, they exhibited extremely high connection reliability at the via-holes, keeping the resistivity change within ±10% even after 1000 thermal shock cycles when tested under the same conditions as described above. According to Examples 4 and 5, since any adjacent circuit layers can be electrically connected through fine via-holes at arbitrary positions, high freedom of wiring design is enjoyed, enabling high-density wiring. Therefore, the low-expansion ML-PWBs of Examples 4 and 5 are suitable for bare chip mount, promising high reliability in electrical connection.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A double-sided circuit board comprising:
    an insulating layer comprising an organic high molecular weight resin; and
    a wiring conductor provided on each side of the insulating layer,
    wherein the wiring conductors are electrically connected through a via-hole, and the via-hole is filled with a conductor comprising solder and a metal powder dispersed therein.

2. The double-sided circuit board according to claim 1, wherein the metal powder has a melting point of 350° C. or higher.

3. The double-sided circuit board according to claim 1, wherein the metal powder is powder of Ni, Au, Ag, Cu, Fe, Al, Cr, Pd or Co, or an alloy comprising at least one of these metals.

4. The double-sided circuit board according to claim 1, wherein the solder comprises at least one of Sn, Pb, Sb, Ag, Cu, Bi and Zn, and has a melting point of 150 to 350° C.

5. A double-sided circuit board according to claim 1, wherein an alloy layer with the solder is formed at the surface of the metal powder.

6. The double-sided circuit board according to claim 1, wherein the metal powder is present in an amount of 0.1 to 60% by weight based on the solder.

7. The double-sided circuit board according to claim 1, wherein the insulating layer further comprises a metal foil as a core.

8. The double-sided circuit board according to claim 7, wherein the metal foil is an Ni—Fe-based alloy having an Ni content of 31 to 50% by weight and has a thickness of 10 to 100 $\mu$m.

9. The double-sided circuit board according to claim 7, wherein the metal foil is Fe, Ni, Cr, Al, Ti, Cu or Co, or an alloy comprising at least two of them.

10. A multilayer wiring board, which comprises a plurality of double-sided circuit boards according to claim 1 which are integrally laminated via an adhesive layer interposed between every adjacent circuit boards, wherein the adhesive layer has at least one through-hole at a predetermined position in contact with the wiring conductors of the adjacent two double-sided circuit boards, and the through-hole is filled with a conductor made of solder by which the wiring conductors of the adjacent double-sided circuit boards are electrically connected.

11. A process for producing a double-sided circuit board according to claim 1, which comprises the steps of:
    (1) providing at least one through-hole in an insulating layer comprising an organic high molecular weight resin;
    (2) pressing a mixture of a metal powder and a solder powder at a predetermined mixing ratio into the through-hole;
    (3) melting the solder powder in the insulating layer into which the metal powder and the solder powder are pressed in the through-hole, under pressure, to fill the through-hole with a conductor of solder having the metal powder dispersed therein; and
    (4) laminating both sides of the insulating layer from step (3) with copper foil and melting the conductor of solder.

* * * * *